United States Patent
Gilman et al.

[11] Patent Number: 5,857,611
[45] Date of Patent: Jan. 12, 1999

[54] SPUTTER TARGET/BACKING PLATE ASSEMBLY AND METHOD OF MAKING SAME

[75] Inventors: Paul S. Gilman, Suffern; Thomas J. Hunt, Peekskill, both of N.Y.; Suresh Annavarapu, Edgewater, N.J.

[73] Assignees: Sony Corporation, Tokyo, Japan; Materials Research Corporation, Orangeburg, N.Y.

[21] Appl. No.: 515,857

[22] Filed: Aug. 16, 1995

[51] Int. Cl.$^6$ .............................. B23K 20/00; C23C 14/34
[52] U.S. Cl. ..................... 228/193; 228/190; 228/235.1; 228/262.5; 228/262.71; 228/262.7; 228/262.21; 228/222; 228/214; 204/298.12; 204/298.13
[58] Field of Search ..................................... 228/190, 193, 228/235.1, 262.5, 262.71, 262.7, 262.21, 222, 214; 204/298.12, 298.13

[56] References Cited

U.S. PATENT DOCUMENTS

| | | | |
|---|---|---|---|
| 5,230,459 | 7/1993 | Mueller et al. | 228/164 |
| 5,397,050 | 3/1995 | Mueller | 228/193 |

FOREIGN PATENT DOCUMENTS

| | | |
|---|---|---|
| 61-288065 | 5/1987 | Japan . |
| 62-167041 | 7/1987 | Japan . |
| 62-067168 | 8/1987 | Japan . |
| 2011759 | 3/1990 | Japan . |
| 6192828 | 10/1994 | Japan . |
| 9217622 | 10/1992 | WIPO . |

OTHER PUBLICATIONS

Diffusion Bonded W–Ti Sputtering Target, *Solid State Technology*, Sep. 1994.

*Primary Examiner*—M. Nuzzolillo
*Assistant Examiner*—Rodney G. McDonald
*Attorney, Agent, or Firm*—Wood, Herron & Evans, L.L.P.

[57] ABSTRACT

A method of forming a sputter target/backing plate assembly comprises the steps of: providing a target fabricated from a first material having a coefficient of thermal expansion; providing a backing plate fabricated from a second material having a coefficient of thermal expansion; providing a block fabricated from a third material having a coefficient of thermal expansion; positioning the block on one side of the backing plate; positioning the target on the other side of the backing plate; and subjecting the target, backing plate and block to elevated temperature and pressure to bond the target, backing plate and block together. The third material is selected so as to have a coefficient of thermal expansion which counteracts the effects of the coefficients of thermal expansion of the first and second materials. The third material may be selected so as to have a coefficient of thermal expansion which is approximately the same as the coefficient of thermal expansion of the first material.

8 Claims, 2 Drawing Sheets

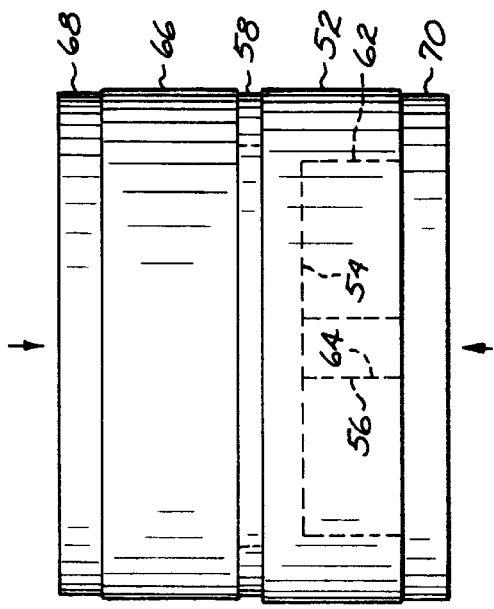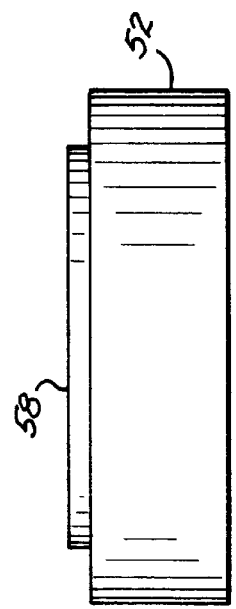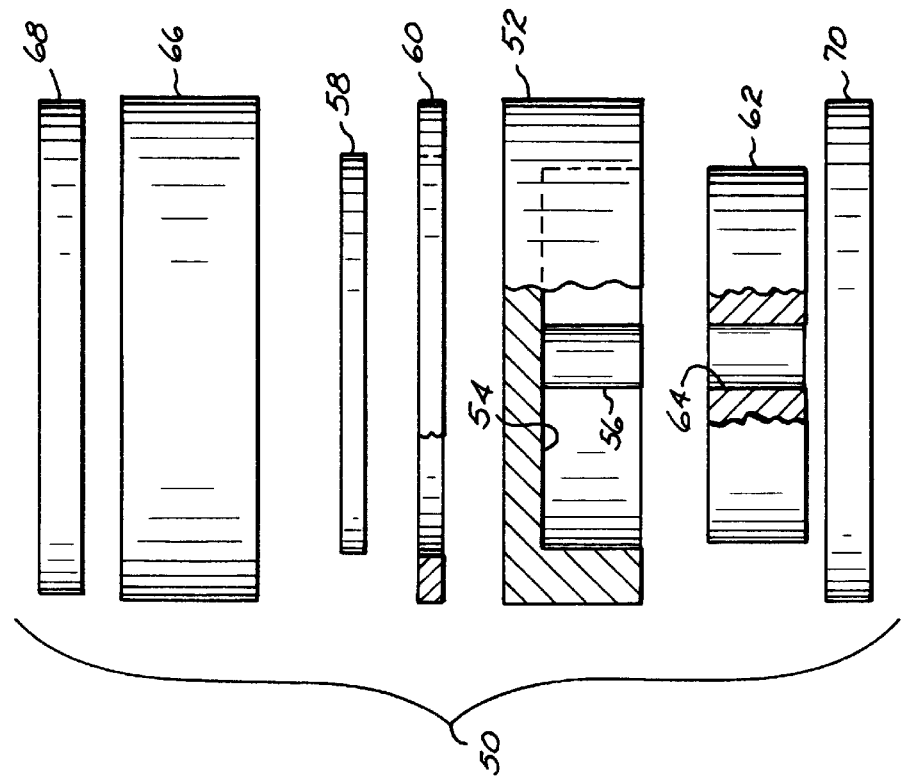

SPUTTER TARGET/BACKING PLATE ASSEMBLY AND METHOD OF MAKING SAME

FIELD OF THE INVENTION

The present invention relates generally to sputtering, and more particularly to sputter target/backing plate assemblies utilized in sputtering operations.

BACKGROUND OF THE INVENTION

Sputtering is the deposition of a thin film of a desired material on a substrate. Sputtering is employed to manufacture semi-conductor devices such as integrated circuits. In a sputtering operation, the material to be deposited on the substrate is removed from a sputter target by bombarding the target with ions. In addition to removing material from the target for deposit on the substrate, ion bombardment transfers thermal energy to the target. It is therefore generally necessary to provide a means of cooling the target during the sputtering operation to prevent the target from overheating.

The target is traditionally mounted to a backing plate. Cooling liquid is circulated in heat transfer contact with the backing plate to remove heat transferred to the target by the bombarding ions. It is important that there be good thermal, as well as structural, bonding between the target and backing plate to ensure adequate heat transfer from target to backing plate to coolant and to ensure the structural integrity of the target/backing plate connection during sputtering.

One technique for bonding the target to the backing plate is known as diffusion bonding. In diffusion bonding the target/backing plate bond is produced by pressing the material surfaces into intimate contact while applying heat to induce metallurgical joining and diffusion to varying extent across the bond interface. Bonding aids, metal combinations which are more readily joined, are sometimes applied to one or both of the surfaces to be bonded. Such coatings may be applied by electroplating, electroless plating, sputtering, vapor deposition or other usable technique for depositing an adherent metallic film. It is also possible to incorporate a metallic foil between bonding members which foil has the ability to be more easily bonded to either of the material to be joined. The surfaces to be joined are prepared by chemical or other means to remove oxides or their chemical films which interfere with bonding.

The target/backing plate assembly may be diffusion bonded using techniques such as hot isostatic pressing ("HIPing") or uniaxial hot pressing ("UHPing"). In UHPing, the unbonded assembly is placed between a pair of plungers, platens or rams. These rams are contained within a control chamber which allows for the control of temperature, pressure and other atmospheric conditions. The controlled atmosphere is a vacuum, reducing gas or inert gas, or a combination thereof. The temperature in the uniaxial hot press control chamber is increased in order to heat the unbonded assembly. The assembly is heated to a temperature somewhat below the homologous melting point of the metal used for the backing plate. By elevating the temperature of the assembly to a temperature somewhat below the melting point of the backing plate material, the backing plate softens, and upon pressing, forms a tight interface with the treated bonding surface of the sputter target. As the assembly is heated, a compressing force is applied on the assembly by the rams in a uniaxial direction. The assembly is maintained in the control chamber under these temperature, pressure and atmospheric gas conditions for a period of time sufficient to form the bonded sputter target/backing plate assembly.

In HIPing, the treated sputter target and backing plate are oriented to form an assembly having an interface defined by the bonding surfaces, and this assembly is placed within a HIPing canister. Once the assembly is placed in the HIPing canister a vacuum is pulled on the canister and the canister is then placed within a HIPing chamber. The ambient atmosphere in the HIPing chamber is replaced with a true inert gas, such as argon or helium. In addition, the temperature and pressure in the HIPing chamber are increased as discussed above with respect to UHPing, in order to form a bonded sputter target/backing plate assembly. Again the assembly is heated to a temperature somewhat below the homologous melting point of the metal used for the backing plate, and the HIPing canister and assembly contained therein are compressed from all sides at elevated pressure. The assembly is maintained at the desired temperature, pressure and atmospheric conditions for a sufficient period to form the bonded target/backing plate assembly.

Representative times, temperatures and pressures for UHPing and HIPing are disclosed in application Ser. No. 08/426,246 filed Apr. 21, 1995, entitled Sputter Target/Backing Plate Assembly And Method Of Making Same, assigned to the assignee of the present invention and hereby incorporated by reference herein as fully set forth in its entirety.

Due to coefficient of thermal expansion induced shrinkage of the bonded target/backing plate during cooling subsequent to the diffusion bonding, any mismatch between the thermal expansion coefficients of the target and backing plate creates stresses in the assembly which can distort the assembly and/or crack the target.

One particular material from which targets are fabricated is tungsten-titanium. Target/backing plate assemblies wherein the target is fabricated from tungsten-titanium have typically employed titanium as the backing plate material to avoid a coefficient of thermal expansion mismatch between the target and backing plate. Titanium is expensive, however, and is thus not desirable as a material from which to fabricate backing plates. Less expensive materials, such as aluminum, have significantly different thermal expansion coefficients from that of tungsten-titanium though, resulting in target/backing plate assembly distortion and/or target cracking.

It is therefore a main objective of the present invention to provide a target/backing plate assembly and method of making same which can accommodate mismatch between target and backing plate coefficients of thermal expansion so as to not jeopardize the thermal and/or structural bond integrity between the target and backing plate.

SUMMARY OF THE INVENTION

The present invention attains the stated objective by providing a method of forming a sputter target/backing plate assembly. The method comprises the steps of: providing a target fabricated from a first material having a coefficient of thermal expansion; providing a backing plate fabricated from a second material having a coefficient of thermal expansion; providing a block fabricated from a third material having a coefficient of thermal expansion; positioning the block on one side of the backing plate; positioning the target on the other side of the backing plate; and subjecting the target, backing plate and block to elevated temperature and pressure to bond the target, backing plate and block together. The third material is selected so as to have a coefficient of thermal expansion which counteracts the effects of the coefficients of thermal expansion of the first and second materials.

The third material may be selected so as to have a coefficient of thermal expansion which is approximately the same as the coefficient of thermal expansion of the first material.

The target, backing plate and block may be diffusion bonded together via hot isostatic pressing or uniaxial hot pressing.

The target is preferably fabricated from tungsten-titanium, the backing plate is preferably fabricated from aluminum and the block is preferably fabricated from graphite. In that event, the target has a coefficient of thermal expansion of approximately $6.4\times10^{-6}/°C$., the backing plate has a coefficient of thermal expansion of approximately $19.8\times10^{-6}/°C$. and the block has a coefficient of thermal expansion of approximately $5.8\times10^{-6}/°C$.

The backing plate preferably has a recess machined therein and the block is disposed in the recess.

The backing plate may have a hub in the center of the recess. In that event, the block has a bore therethrough for receiving the backing plate hub.

The present invention also provides a target/backing plate assembly formed by the method.

The major advantage of the present invention is that a target/backing plate assembly and method of making the same is provided which allows targets and backing plates fabricated from dissimilar materials having dissimilar thermal expansion coefficients to be diffusion bonded without suffering assembly distortion or target cracking during cooling.

These and other objects and advantages of the present invention will become more readily apparent during the following detailed description taken in conjunction with the drawings herein, in which:

BRIEF DESCRIPTION OF THE DRAWINGS

FIGS. 3A and 3B diagrammatically illustrate the series of steps performed in accordance with the method of forming an alternative form of sputter target/backing plate assembly of the present invention; and FIG. 4 illustrates a sputter target/backing plate assembly made in accordance with the method of FIGS. 3A and 3B.

DETAILED DESCRIPTION OF THE INVENTION

Figure 1B:
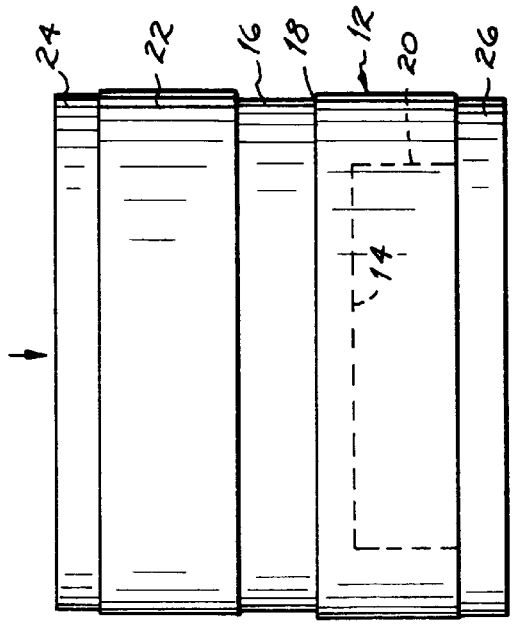
FIGS. 1A and 1B diagrammatically illustrate the series of steps performed in accordance with the method of forming a sputter target/backing plate assembly of the present invention.
Figure 1A:
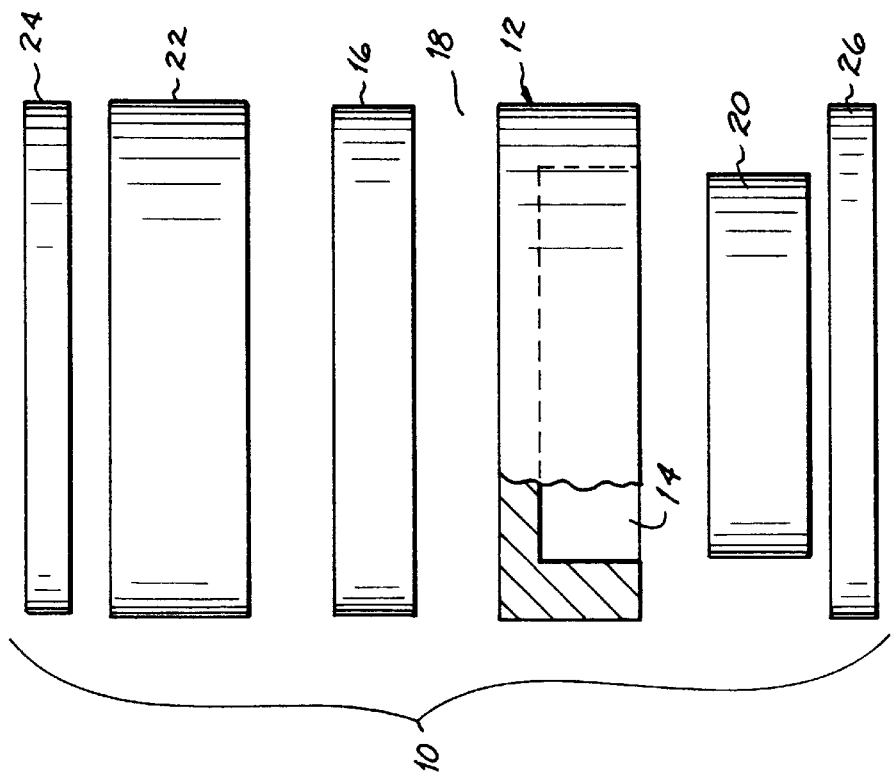

Referring first to FIG. 1A, there is illustrated an assembly 10 for loading into a HIPing canister for subsequent subjection to HIPing.

The assembly 10 includes an aluminum backing plate 12 which includes a recess 14 machined into one side thereof and a tungsten-titanium target 16 for bonding to the backing plate 12 at a bond interface 18. A graphite block 20 is provided for insertion into recess 14. A dummy aluminum backing plate 22 is positioned above the target 16. Upper and lower steel plates 24 and 26 respectively are positioned above the dummy backing plate 22 and below the backing plate 12 with block 20 therein.

As illustrated in FIG. 1B, the assembly 10, which would be contained in a HIPing canister (not shown) on which is pulled a vacuum of about $10^{-2}$ torr or greater, is diagrammatically illustrated as being subjected to elevated temperature and pressure as would be the case when contained in a HIPing vessel. Alternatively, FIG. 1B illustrates the assembly 10 subjected to elevated temperature and pressure as would be the case when subjected to UHPing, also at about $10^{-2}$ torr.

The assembly 10 is heated to a temperature of from about 300° C. to about 575° C., and preferably from about 450° C. to about 550° C., and is pressed to a pressure of from about 30 MPa to about 140 MPa, and is maintained there for from about 30 minutes to about 60 minutes. If UHPing is used, the pressure is developed between a pair of plungers, platens or rams. If HIPing is used, the HIPing canister and assembly 10 therein is subjected to compressive pressure from all sides in the HIPing vessel. By elevating the temperature of the assembly to a temperature somewhat below the melting point of the backing plate material the backing plate 12 softens, and upon pressing, forms a tight interface with the bonding surface of the sputter target 16. Similarly, the block 20 bonds with the underside of the backing plate 12.

During cooling of the assembly 10, the graphite block 20 restrains the shrinkage of the aluminum backing plate 12 so that the thermal contraction of the composite backing plate 12 and block 20 is approximately the same as that of the tungsten-titanium target 16. Typically the tungsten-titanium target has a coefficient of thermal expansion of approximately $6.4\times10^{-6}/°C$., the aluminum backing plate has a coefficient of thermal expansion of approximately $19.8\times10^{-6}/°C$. and the graphite block has a coefficient of thermal expansion of approximately $5.8\times10^{-6}/°C$. Thus the graphite block 20 has about the same thermal expansion coefficient as that of the tungsten-titanium target 16. Distortion of the target 16 and backing plate 12 and/or cracking of the target 16 is thereby avoided.

Figure 2:
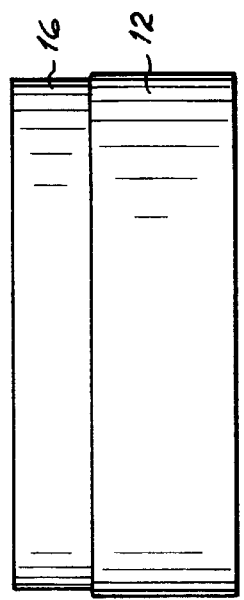
FIG. 2 illustrates a sputter target/backing plate assembly made in accordance with the method of FIGS. 1A and 1B.

Lastly, as shown in FIG. 2, the cooled assembly 10 has had the steel plates 24 and 26 and dummy backing plate 22 machined away. In addition, the block 20 has been machined from the recess 14 to provide access to the backing plate 12 by the coolant when installed onto a cathode assembly.

Referring now to FIG. 3A, an alternative assembly 50 is illustrated. The assembly 50 includes an aluminum backing plate 52 which includes a recess 54 machined into one side thereof and a central hub 56 for attaching the backing plate 52 to a cathode assembly. A tungsten-titanium target 58 is located within an aluminum spacer ring 60 for bonding to the backing plate 52. A graphite block 62 is provided for insertion into recess 54 and includes a bore 64 therethrough for accepting the hub 56. A dummy aluminum backing plate 66 is positioned above the target 58. Upper and lower steel plates 68 and 70 respectively are positioned above the dummy backing plate 66 and below the backing plate 52 with block 62 therein.

As in the prior embodiment, the assembly 50 is subjected to the same pressures and temperatures for the same duration by way of either HIPing or UHPing (FIG. 3B). During cooling of the assembly 50, the graphite block 62 restrains the shrinkage of the aluminum backing plate 52 so that the thermal contraction of the composite backing plate 52 and block 62 is approximately the same as that of the tungsten-titanium target 58. Distortion of the target 58 and backing plate 52 and/or cracking of the target 58 is thereby avoided.

Lastly, and also as in the prior embodiment, as shown in FIG. 4, the cooled assembly 50 has had the steel plates 68 and 70 and the dummy backing plate 66 machined away. In addition, the block 62 has been machined from the recess 54 to provide access to the backing plate 52 by the coolant when installed onto a cathode assembly.

Those skilled in the art will readily recognize numerous adaptations and modifications which can be made to the present invention which will result in an improved sputter target/backing plate assembly and method, yet all of which will fall within the spirit and scope of the present invention as defined in the following claims. For example, many other materials other than tungsten-titanium, aluminum and graphite can be used to fabricate the target, backing plate and block respectively. And, other bonding techniques other than diffusion bonding can be employed. Accordingly, the invention is to be limited only by the scope of the following claims and their equivalents.

What is claimed is:

1. A method of forming a sputter target and backing plate assembly comprising the steps of:

providing a target fabricated from a first material having a coefficient of thermal expansion;

providing a backing plate fabricated from a second material having a coefficient of thermal expansion;

providing a block fabricated from a third material having a coefficient of thermal expansion;

positioning the block on one side of and in contact with the backing plate;

positioning the target on a second side of and in contact with the backing plate;

subjecting the target, backing plate and block to elevated temperature and pressure to bond the target and backing plate together;

the third material being selected so as to have a coefficient of thermal expansion which counteracts the effects of the coefficients of thermal expansion of the first and second materials; and removing the block from the backing plate after the target and backing plate have bonded together.

2. The method of claim 1 wherein the third material is selected so as to have a coefficient of thermal expansion which is approximately the same as the coefficient of thermal expansion of the first material.

3. The method of claim 2 wherein the target, backing plate and block are diffusion bonded together via hot isostatic pressing.

4. The method of claim 2 wherein the target, backing plate and block are diffusion bonded together via uniaxial hot pressing.

5. The method of claim 2 wherein the target is fabricated from tungsten-titanium, the backing plate is fabricated from aluminum and the block is fabricated from graphite.

6. The method of claim 5 wherein the target has a coefficient of thermal expansion of approximately $6.4 \times 10^{-6}/°C.$, the backing plate has a coefficient of thermal expansion of approximately $19.8 \times 10^{-6}/°C.$ and the block has a coefficient of thermal expansion of approximately $5.8 \times 10^{-6}/°C.$ 7. The method of claim 1 wherein the backing plate has a recess machined therein and wherein the block is disposed in the recess.

8. The method of claim 7 wherein the backing plate has a hub in the center of the recess, and wherein the block has a bore therethrough for receiving the backing plate hub.

* * * * *